United States Patent [19]
Feit

[11] 4,201,580
[45] May 6, 1980

[54] LITHOGRAPHIC FABRICATION WITH TREATMENT OF "LIVING POLYMER"

[75] Inventor: Eugene D. Feit, Berkeley Heights, N.J.

[73] Assignee: Bell Telephone Laboratories, Incorporated, Murray Hill, N.J.

[21] Appl. No.: 926,877

[22] Filed: Jul. 24, 1978

[51] Int. Cl.² .......................... G03C 5/00; G03C 1/68
[52] U.S. Cl. .................................... 430/319; 96/35.1;
96/115 R; 96/36.2; 204/158 HA; 204/154.17;
204/159.2; 427/44; 427/43.1; 526/293;
430/942; 430/966; 430/322; 430/329; 430/285
[58] Field of Search .................... 96/36, 35.1, 115 R,
96/36.2; 427/43, 44; 346/135; 526/43, 293;
204/158 HA, 159.17, 159.18, 159.2

[56] References Cited
U.S. PATENT DOCUMENTS

| | | | |
|---|---|---|---|
| 3,370,981 | 2/1968 | Ney et al. | 428/913 X |
| 3,425,867 | 2/1969 | Stillo et al. | 346/135 |
| 3,679,497 | 7/1972 | Handy et al. | 427/43 X |
| 3,798,187 | 3/1974 | Miyoshi et al. | 204/159.2 X |
| 3,984,583 | 10/1976 | Hermans et al. | 427/43 |
| 4,061,799 | 12/1977 | Brewer | 427/43 |
| 4,143,221 | 3/1979 | Naarmann et al. | 526/43 X |

OTHER PUBLICATIONS

Jenkins et al., Journal of Applied Polymer Science, vol. 12, 1968, pp. 2059-2066.

Primary Examiner—Edward C. Kimlin
Attorney, Agent, or Firm—George S. Indig

[57] ABSTRACT

Fabrication of fine dimensioned circuits, e.g., VLSI includes at least one lithographic step dependent upon members of a particular category of polymer resists. Such resists, generally negative acting, are characterized by high contrast due to unusually narrow molecular weight distribution of the polymer molecules. This distribution is in turn dependent upon choice of a base polymer which is itself characterized by narrow molecular weight distribution due to "living polymerization" (solution anionic, polymerization). Functionalization of such base polymer is designedly such as to retain narrow distribution. Chlorinated polystyrene is exemplary of the resist category.

11 Claims, No Drawings

4,201,580

LITHOGRAPHIC FABRICATION WITH TREATMENT OF "LIVING POLYMER"

BACKGROUND OF THE INVENTION

A. Technical Field

Fabrication of small circuits and circuit elements, e.g., large scale integrated circuits (LSI) is realized through one or more pattern delineation steps. In accordance with prevalent practice at this time, use is made of discrete masks which, when finally processed, consist of apertured chromium patterns supported on glass substrates. Typically a set of six or more such masks are required for semiconductor circuit fabrication. They are utilized sequentially for replicating patterns in sensitive supported (resist) material on the semiconductor, following which the replicated pattern is utilized to define areas to be etched, plated, implanted, or otherwise processed. There is a growing technology which involves electron beam delineation to produce such masks with design rules of a few micrometers or less. Replication is generally accomplished with near u.v. light.

The expectation that economic and other considerations may lead to smaller design rules has focused attention on inherent limitations in presently used mask technology. Standing waves, interference and other limitations relating to wavelength have led to studies directed to the use of effectively shorter wavelength replicating radiation such as X-ray, electron flood, and short wavelength u.v. Anticipated yield loss due to registration difficulty with diminishing design rules is leading to evolution of a "maskless" technology known as "direct processing." In this technology, the primary pattern delineation is in resist layers adherent to the device at each stage in fabrication. All such fine-line programs are dependent upon suitable resists.

B. History

A variety of extremely sophisticated negative resist materials have been developed to meet circuit fabrication needs. A resist now in widespread commercial use is based on an addition polymer of glycidyl methacrylate (GMA) and ethyl acrylate (EA) (see, 12, *J. Vac. Sci. Technol.*, 1957 (1975). The material is excellent for its intended purpose of mask fabrication based on pattern design rules of a small number of microns. It is of limited utility for maskless fabrication (direct processing), since it degrades at a significant rate in certain processing environments.

Improved stability to dry processing characterizes a family of resists which are chemically related to GMA-EA. Again, the primary radiation-responsive mechanism, cross linking via epoxy moieties, is sufficiently sensitive to permit use of usual energy sources; e.g., tungsten or thorated tungsten electron sources in commercial raster scan or vector scan 1:1 mask makers. Inclusion of aryl moieties largely in lieu of EA results in a significant increase in stability attributed to the inherent resonant nature of the substituent. Loss in lithographic sensitivity is, in part, retrieved through halogenation of the aryl grouping, e.g., GMA-chlorostyrene sometimes denoted as GMC.

An outgrowth of the GMC effort resulted in the finding that polychlorostyrene itself has promising resist properties. Borderline sensitivity (while sufficient for many purposes is only barely adequate for use on some existing primary pattern e-beam generators) is to a large extent offset by dry processing stability.

It is the experience of workers in the field, that the best negative resists have less resolving power than the best positive resists. Resolution limitations observable as ragged interfaces at feature edges are generally attributed to backscattered energy. This limitation is particularly significant in electron beam lithography where design rules are likely small and where backscattered electrons are sufficient to cause some crosslinking of "unexposed material." It follows that a significant characteristic of a negative resist—particularly a negative resist designed for fine-line lithography—is the breadth of the incident radiation dose which results in insolubilization, e.g., crosslinking. This characteristic in turn is dependent upon molecular weight distribution with the very important parameter of breadth of radiation dose required for crosslinking decreasing as molecular weight distribution approaches the theoretical unity level. This relationship is readily understood on the basis that requisite insolubilization on the average results from but one crosslink per molecule so that effective sensitivity varies with polymer weight (increases with increasing polymer weight). It is therefore well acknowledged that narrow molecular weight distribution is a desirable feature—one of increasing importance with decreasing design rules.

Resists of the nature described above, generally produced by free radical polymerization, are characterized by molecular weight distributions ("MWD") numerically greater than 2, as usually defined. The parameter here is the ratio: weight average molecular weight/number average molecular weight ($M_w/M_n$). This parameter as so defined is in prevalent use (see for example L. H. Peebles, Jr., *Molecular Weight Distributions in Polymers*, Interscience, (1971)).

SUMMARY OF THE INVENTION

Inventive processes designed to produce articles such as masks or final circuits as well as descrete devices are based on processes involving at least one lithographic step based on use of a member of a specified class of negative resists. Excellent resolution is attributable to extremely narrow molecular weight distribution—distribution which, as expressed in the usual ratio of $M_w/M_n$ is numerically less than 2 usually less than 1.8 desirably 1.5 or less—in preferred cases at levels approaching unity.

Resists upon which inventive processes are based are prepared by functionalization of base polymers which are themselves prepared by ionic processes, generally anionic processes, inherently resulting in narrow molecular weight distribution. Processes of this nature in which polymerization may proceed to termination without significant termination due to premature reactions are characterized as "living polymerization". In a particular exemplary embodiment, polystyrene prepared by anionic solution polymerization is halogenated in such a manner as to retain a final effective molecular weight distribution of about 1.1 so indicated lithographically.

Exemplary chlorinated polystyrene is through IR (infrared) spectroscopy and other investigatory techniques found to be largely composed of poly-4-chlorostyrene in common with the prior studied material produced by free-radical polymerization of 4-chlorostyrene monomer. Other spectroscopic peaks, however, suggest chlorination to some extent occurring at other positions on the styrene moiety (see T. Okumoto and T. Takeuchi, *Macromol. Chem.*, 167, 305 (1973). While halogenation of the main chain is not precluded, other studies suggest sufficient steric hindrance to ionic processes and absence of free-radical processes such as to minimize substitution at the site of secondary and ternary carbon as observed by J. C. Bevington and L. Ratti *European Polym J.* 8, 1105 (1972). In other respects, chlorinated polystyrene (in accordance with the invention) is quite similar to prior art polychlorostyrene. Resist sensitivity for given forms of actinic radiation has about the same dependence on molecular weight and about the same value for a particular molecular weight. Stability to dry process—stability in general—remain at the same excellent level as the prior art material.

In generic terms, it is the inventive promise that the route necessarily followed in synthesis of resist materials of the invention is two step: (1) "living polymerization" of base polymer, and (2) functionalization of such polymer. Since the nature of the negative resist is insolubilization due to reactive substituents and since the existence of such substituents (the functional groupings) result in competing reactions leading to premature termination, it is not expected that the narrow distribution afforded through "living polymerization" can result from a one step process (ignoring fractionalization of free radical polymerized material to result in impractically small yield). While much of the disclosure is in terms of functionalized polystyrene and indeed such base polymer is exemplary, other base polymers may be used. Examples of such materials which may be produced ionically to result in narrow molecular weight distribution are listed, for example, by M. Morton and L. J. Fetters in Chapter 5 of *The Stero Rubbers*, W. A. Saltman, Ed., John Wiley and Sons, N. Y., 1977.

"Functionalization" appropriate to the invention, while not novel per se, is critical. Substitutions by active substituents which impart resist characteristics, must be carried out through procedures which themselves have little deleterious effect on MWD. So, for example, epoxy functionalization by presently used procedures results both in crosslinking and in oxidative degradation to randomize the polymer weight distribution. Epoxidized polybutadiene, a negative electron resist is generally characterized by broad distribution.

DETAILED DESCRIPTION

A. General

Commercially significant aspects of the invention are dependent upon use of negative acting resists of a specified category. Invention generally in process terms is dependent upon high resolution which in turn gives rise to capability for fine-line lithography. Lithographic processing is presently used in the fabrication of large scale integrated silicon circuits (LSI), as well as such circuits of somewhat finer dimension than those commonly in use, (Very Large Scale Integrated circuits). Inventive procedures are also applicable to discrete device fabrication, as well as other types of circuits, e.g., integrated optics, magnetic bubbles. Regardless of the nature of the final product, the lithograhic procedure may be used at either or both of two levels: (1) in fabrication of a mask which is subsequently used in the fabrication of circuits or devices or, (2) in the direct fabrication of the device or circuits themselves. Regardless of whether the lithographic process is mask or maskless, resist is initially present as a homogeneous adherent layer which is subsequently exposed to electron beam or other actinic radiation. The effect of the radiation is to alter the resist in irradiated areas to alter ease of removability—generally to alter solubility with respect to a developer. In the instance of negative resists, the effective radiation is to decrease solubility so that development results in preferential removal of unexposed regions.

The developed, patterned resist layer now serves as a masking layer. In the instance of the usual form of LSI mask, the underlying layer may be chromium or chromium oxide. In direct LSI processing, underlying material may consist of silicon (often "polysilicon," i.e., polycrystalline silicon), silicon oxide, silicon nitride or other insulating or passivating layers. Other types of circuitry may utilize layers of active optical material such as lithium niobate, or active magnetic material such as substituted yttrium iron garnet or permalloy. Particularly in direct processing—especially in many layered fabrication—use may be made of layer/s intermediate the resist and the active material layer. Such intermediate layers may serve, for example, to minimize processing difficulties resulting from steps due to prior processing. Such difficulties include coverage of steps, as well as delineation problems due to standing waves, etc.

Processes of the invention contemplate preferential treatment of underlying active layers as defined by apertures in the masking resist layer (whether or not intermediate layers are present). Processing of active surfaces may be by wet chemistry but increasingly involve dry chemistry. Device design evolution in the direction of a miniaturization has produced a growing trend to dry processing, e.g., plasma etching, ion milling, ion implantation, plasma deposition, etc.

Inventive processes generically represent an advance in the attainment of high resolution images due to narrow resist MWD characteristics. High resolution is of primary interest for small feature size with fabrication step/s beneficially carried out using dry processing. Fortunately, the "living polymerization," to which high resolution is ultimately attributed, is feasibly carried out with resonant monomers which inherently result in polymers having stability to dry processing.

B. Composition

Resist compositions are generally characterized as functionalized narrow MWD polymers or more precisely as such materials which are themselves possessed of narrow MWD. Orthodox polymerization routes—starting with the monomer precursor of the resist polymer—do not generally admit molecular weight distribution less than about 2. Accordingly, resists suitable for the inventive process herein may be characterized as having MWD of less than 2. "Living polymerization, " even to molecular weights in excess of one million, regularly permits distributions of 1.5 and better, and resulting polymers may be functionalized to result in improved resolution attributable to narrow MWD. Distributions of 1.8 and better lead to substantial enhancement in permitted resolution. Resist compositions herein are generally considered in terms of distributions of 1.8 and less. Exemplary materials may have distributions of as good as 1.5, preferably 1.25 or even 1.10 or less, and these constitute preferred embodiments.

A major thrust of the invention concerns direct processing which, in terms of negative resist materials, gives rise to inclusion of resonant moieties. Since styrene and higher order homologues may be polymerized to result in monodisperse polymers, functionalized aryl-containing polymers themselves constitute a preferred embodiment with halogenated—particularly chlorinated—polystyrene being exemplary.

C. Resist Synthesis

1. The base polymer is produced by living polymerization which contemplates ionic, generally anionic, solution polymerization. Polystyrene is perhaps the best known of the monodisperse polymers, and its preparation is described, for example, in (1) L. J. Fetters and M. Morton, edited by J. A. Moore, *Macromolecular Syntheses* collective volume 1, 463, (1977); and in (2) W. R. Sorenson and T. W. Campbell, *Preparative Methods of Polymer Chemistry*, Second Edition, 278. Monodisperse polystyrene is commercially available in a variety of molecular weights from less than 1000 to many millions. MWD of commercially available standards range from below 1.1 (e.g., T. Altares and E. L. Clark, *Prod. Res. Develop.*, 9, 168 (1970). Higher molecular weight standards of the order of many millions are characterized by somewhat greater distribution, but still at levels appreciably below 1.5.

It is unnecessary to detail preparatory techniques for monodisperse polymers. Briefly, polymerization entails the usual monomer and initiator. The monomer is of such nature that the fundamental polymerization reaction dominates by far over competing reactions. Initiators may be organometallic. A significant procedural step is removal or avoidance of impurities that can react with active chain ends or with initiator, either to randomly terminate polymerization or to promote competing reactions. As described in the references cited, even trace amounts of impurities must be removed at least to a level below that of the general concentration of initiator ($10^{-3} - 10^{-5}$ M).

Polymerization is carried out in solvent which itself must be carefully purified. Purification typically includes degassing and distillation. Procedures are often carried out in the absence of light to prevent introduction of impurities by photoinduced reactions.

Monomer must also be carefully purified: again it must be degassed, perhaps in several sequential steps, distilled, and perhaps chemically purified by selective reaction.

Initiator purification may be relatively simple. n-Butyllithium may be purified by high vacuum distillation. Initiator, once purified is, in accordance with commercial practice, placed in an ampoule which is stored in the frozen-degassed state. Polymerization is carried out in such manner as to favor low distribution. In general, if competing reactions are minimized by purification precautions described, attention need here be directed only to the competing initiation and propagating processes. Acceleration of the initiation rate relative to the propagation rate favors narrow distribution.

In the instance of polymerization of monodisperse polystyrene, tetrahydrofuran is usefully included with the butyllithium initiator-styrene monomer pair for the reason that it accelerates polymer initiation. In a reported example in the first reference cited above, 10.5 grams of monomer, 250 cc of cyclohexane solvent, $5.1 \times 10^{-4}$ M butyllithium initiator, $1.5 \times 10^{-2}$ M tetrahydrofuran resulted in monodisperse polystyrene of an $M_w/M_n$ ratio of $8.1 \times 10^4$ G/mole/$8.0 \times 10^4$ G/mole=1.125. As there noted, synthesis of monodisperse poly(isoprene) has been carried out in analogous fashion.

D. Functionalization

A simplifying assumption has been made with regard to the concept MWD as applied to functionalized polymer. MWD of the base polymer e.g., monodisperse polystyrene is measured in terms of the ratio $M_w/M_n$ as indicated, to result in the numerical values set forth. Functionalization, e.g., chlorination of polystyrene, is carried out in such manner as to result in retention of narrow MWD. Lithographic results observed are in fact consistent with retention of numerical values, in each instance approximating those of the base polymer. This observation is sufficient verification of the inventive concept.

In fact, however, the significance of MWD is based on the assumption of chemical identity from molecule to molecule—an assumption which is certainly correct for the base polymer. In fact, in a more general sense the relevant parameter is not molecular weight, but polymer length. MWD is a fair indication of molecule length only for uniform composition. Functionalization particularly by substitution with a heavy atom, (e.g., chlorine) itself affects molecular weight. Nonuniform chlorination from molecule to molecule may produce a molecular weight variation, and consequent broadening of MWD which is quite independent of molecule length. The possibility exists therefore that functionalization could result in some MWD broadening while still assuring the improved resolution characteristic of the base polymer MWD value.

In the instance of chlorination of polystyrene, and other generalized functionalization techniques, the two parameters are closely related so that MWD may be expected to follow lithographic quality. This coincidence comes about by virtue of the presence of preferred reaction sites. In an otherwise unsubstituted aryl moiety, the -4 carbon position is relatively reactive so that functionalization takes place preferentially at that site. It has been observed that chlorination at a level sufficient to introduce a single chlorine on each moiety, in fact accomplishes that end to a close approximation. Continued functionalization, however may occur at the ortho positions. Since there are two ortho positions per moiety, functionalization to a level of less than three functional groups per moiety may result in an MWD breadth showing some disparity from the relevant molecular length parameter.

The second and final step in preparation of the resist is functionalization of the monodisperse polymer. It is essential that the procedure be such as to result in retention of an $M_w/M_n$ ratio desirably at or below 1.8. A particular functionalization expediently carried out with the preferred resonant moiety-containing polymers involves halogenation. Since polychlorostyrene had already been found promising as a negative resist, much of the earlier work and consequently much of this description is in terms of chlorination of monodisperse styrene to produce a narrow molecular weight version of this otherwise prior art resist. It has been noted that the monodisperse chlorinated material produced from polystyrene having an MWD of 1.06 has characteristics in common with that of the conventionally produced broad distribution material. Chemically, while much of the chlorination occurred at the -4 carbon position, IR studies showed some bonding at other positions, notably at a -2 carbon. An exemplary chlorination resulting in essentially monochloro-substitution is set forth.

EXAMPLE 1

Polystyrene (2.5 grams, $M_w = 154{,}000$, $M_w/M_n \leq 1.06$) was dissolved in 250 ml. of carbon tetrachloride. At room temperature and in dim light, trifluoroacetic acid (55 ml.) and chlorine (4 g) were added sequentially and with stirring. The addition of the gas took 12 minutes. The traps and lines were purged into the reactor with nitrogen and the reaction was continued for 40 additional minutes. At this time, the reaction mixture was cloudy. Nitrogen was then bubbled through the mixture to blow-out excess chlorine. The polymer was separated from the reaction mixture by precipitation into methanol. It was redissolved in pyridine and reprecipitated into methanol. The dried yield was 3.4 g.

Chlorination of monodisperse polystyrene has been carried out under other conditions, for example, such as to result in greater than 1 chlorine per aryl grouping. As to the latter, molecular weight distribution was not adversely affected. However, like polymerized chlorostyrene with similarly increased chlorine content, some drop off in contrast was indicated.

In general, functionalization like monodisperse polymerization procedures are known. Monodisperse polyethylene oxide, polypropylene oxide, polytetrahydrofurane, as well as polybutadiene and polyisoprene may be prepared following known procedures. Some of these, for example, polybutadiene, are not easily functionalized without degradation or cross-linking which causes increase in molecular weight distribution (epoxidation of polybutadiene results in both reactions: degradation from oxidation and cross-linking via the active epoxy grouping).

In general, functionalization by halogenation may proceed along the general procedural lines of Example 1. Fluoridation is not generally of interest in resist synthesis, since its use introduces adherence problems. Bromination may result in compounds of interest.

D. Characterization of the Resist

The inventive teaching is largely concerned with improved resolution as a result of narrowed molecular weight distribution. Contrast defined as the slope of the linear portion of relative thickness on the ordinate and incident radiation dose on the abscissa where relative thickness is the fractional layer thickness retained after development has been found to be approximately 2.3 for the material of Example 1.

Other properties are those already known to be characteristic of polychlorostyrene. Sensitivity in microcoulombs/cm$^2$ for retention of 80% of the original layer thickness was at 10 kV of electron acceleration energy for the material prepared in accordance with Example 1. In the same terms, sensitivity was at a level of 4 microcoulombs/cm$^2$ for increased chlorination of a similar monodisperse polystyrene. Contrast, however, was reduced to a value of approximately 1.8. Both values of sensitivity are considered marginally acceptable for the most demanding commercial use at this time—that is, for use with commercially available raster scan 1:1 e-beam primary pattern generators.

In other respects, characteristics are exemplary. Development proceeds with virtual absence of swelling, and the presence of the aryl moiety, originally considered to improve dry processing stability continues to serve this function.

E. Device Fabrication

The following general procedure is fairly descriptive of a usable technique. Resist material is dissolved in a suitable solvent, such as, chlorobenzene and is filtered, for example, through a filter with a pore size of 0.2 $\mu$m or less. A substrate surface is wetted by the solution. Adequate thickness uniformity results from spin coating at from 1000 to 10,000 rpm.

The resultant coating is then baked to remove excess solvent. Equivalent results have been produced by baking in vacuum, in air, or in an inert atmosphere, such as, nitrogen. A suitable temperature range is from 50 degrees C. to 150 degrees C. for a period of from 30 to 60 minutes. This is not a critical step, and it is only necessary to produce a coating which is solvent-free without premature cross-linking. The ranges set forth are sufficient to assure drying without measurable cross-linking.

Exposure may be carried out with X-ray wavelength of from 0.5 to 10 Angstrom units for periods dependent on absorption. Electron beam voltage of from 3 to 30 kilovolts with an integrated incident dose of from $2 \times 10^{-7}$ to $1 \times 10^{-5}$ Coulombs/square centimeter results in usable resist thickness for many purposes. Retention of an entire film thickness of 1 $\mu$m requires a dose of about $10 \times 10^{-6}$ Coulombs/cm$^2$ at 10 kV.

Development, that is dissolution of the unexposed portion of the film, may be carried out in any suitable solvent. Comparative examples reported herein were carried out with mixtures of nitropropane and isopropyl alcohol. Development may be by simple immersion or by spraying. Images in accordance with the examples were produced with development times of from 20 to 60 seconds. Since the cross-linked film is substantially insoluble in suitable solvent systems, development times noted may be exceeded by a factor of 10 or more without significant impairment of contrast.

Developed images are post-baked primarily to improve adhesion (by removal of developer) and sometimes to increase cross-linking. The post-bake is even less critical than the initial baking, since exceeding temperature of time within reason can only result in greater cross-linking. Temperatures of from 60–180 degrees C. for time periods of from five to 120 minutes are exemplary. Again, this baking step may be carried out in vacuum or inert atmosphere.

This section is largely in terms of fabrication of large scale integrated circuits, LSIs. At this time most significant contemplated use concerns fabrication in/on epitaxial silicon layers supported by silicon substrates. There is also interest in other semiconductors as well as in magnetic devices such as bubble devices. Fabrication of typical bubble devices involves patterning of magnetic garnet epitaxial layers and permalloy. Integrated optic circuits represent another example of fine line devices which may be fabricated by use of the invention. Materials to be patterned may include SiO$_2$, LiNbO$_3$, LiTaO$_3$, etc.

The inventive teaching is of particular significance in the fabrication of fine features by dry processing. However, commercial practice which favors minimum inventory and efficient use of apparatus may result in use in less demanding processing steps as well.

A brief fabrication outline of a silicon integrated circuit is set forth for illustrative purposes. The procedure contemplates use of a silicon wafer bearing an epitaxial layer of device grade silicon of appropriate conductivity ype, resistivity, thickness, etc. The listing is generally in a form appropriate for MOS fabrication. A variety of alternatives which may concern bipolar, as well as MOS devices, are contemplated. Each of the enumerated steps assumes prior deposition, delineation, and processing to result in a completed resist pattern. The outline is in tabular form with each step where suitable in terms of two alternative entries—first directed to wet processing and the second to dry. Also unstated, but common to each level with the possible exception of the terminal step, (unless otherwise noted) is stripping of the resist pattern after processing.

Dry processing contemplates modification of bared regions of substrate by a vapor agent. For these purposes, dry processing contemplates all nonliquid/nonsolid media whether uncharged or charged; whether of balanced or unbalanced charge. The term "plasma" is used without regard to special meanings sometimes assigned by specialists in different disciplines—e.g., it does not necessarily connote a medium within a volume in which charges are balanced on a macroscale. At this time, a variety of dry processing steps are in use. Descriptive terms sometimes overlapping but all contemplated where the term dry processing is used include: ion etching, ion beam milling, reactive ion etching, plasma etching, reactive sputter etching, sputter etching, and gas phase chemical etching.

Dry processes may also be designed to modify underlying substrates through material introduction or other mechanism, as well as removal. Such dry processing may involve true material addition as an implantation, vacuum deposition, sputter deposition, as well as deposition through reduction or oxidation reactions; or other change, such as, local strain enhancement, e.g., as resulting from lattice distortion due to high energy bombardment. The enumeration is not intended to be exhaustive.

Inverse masking (lift-off) is conventionally used for delineating final metallization levels, e.g., on semiconductor devices, as well as photomask patterns. The process entails pattern delineation of the resist followed by flood deposition (overall deposition covering both masked and unmasked regions) of the desired film and subsequent stripping of the resist film in a suitable solvent. To the skilled artisan, it is meaningful to consider such a combined process as "dry processing" for the reason that flood deposition—ordinarily by use of a vapor species—is resolution controlling.

All such designated species, as well as others that may envolve, are desirably incorporated in circuit fabrication, generally, to more easily realize fine resolution and line width control.

While an advantage of the inventive resists is their comparative stability to dry processing media, they have been found suitable for wet processing procedures, as well. It is not generally alleged that these resists are necessarily superior to known resists in use at this time. It is possible that their use in wet processing may be a matter of convenience. In general, in commercial processing economy in use of apparatus as well as in inventory control is realized by minimizing the number of agents used. Wet etching contemplated, therefore, includes the whole spectrum of procedures in use or to be used. A listing of contemplated wet processes includes: liquid etching, electrode, electroless, or displacement plating.

Silicon LSI Fabrication Procedures
(1) Etching of CVD Silicon Nitride
DRY:
Reactor: Parallel plate (Conditions noted are for a 15" diameter reactor)
Gas mixture: 80–75 vol. % tetrafluoromethane (TFM)-remainder oxygen
Power: 75–450 watts
Pressure: 0.1–0.5 Torr
Flow Rate: 60–250 cubic centimeters/minute
Etch Rate: 100–300 nanometers/minute
(2) Etching of Pyrolytic Silicon Nitride
DRY:
Reactor: Parallel plate (conditions noted for a 15" diameter reactor)
Gas Mixture: 40–65 vol. % perfluoroethane remainder trifluoromethane
Power: 750–1250 watts
Pressure: 0.5–0.9 Torr
Flow rate: 60–120 cu. cm/min.
Etch rate: 15–35 nanometers/min.
(3) Etching of Phosphorous Doped Glass
WET:
The liquid etch is a solution of 15 parts by volume hydrofluoric acid; 10 parts by volume nitric acid; and 300 parts by volume water. The etch rate from this mixture is approximately 12–15 micrometers/min.
DRY:
Dry etching conditions are identical to that of pyrolytic silicon nitride with a resulting etch rate of 100–200 micrometers/min.
(4) Etching of Polysilicon
WET:
The liquid etchant is a mixture of 3 parts by volume hydrofluoric acid and 5 parts by volume nitric acid. The etch rate, typically 20 nanometers/min., is dependent on the type of amorphous silicon being etched.
DRY: Isotropic Dry Etching
Reactor: 15" diameter parallel plate.
Gas Mixture: 85–95 vol. % carbon tetrafluoride, remainder oxygen.
Power: 100–300 watts
Pressure: 0.2–0.4 Torr
Flow rate: 90–160 cu. cm/min.
Etch rate: 100–200 nanometers/min.
DRY: Anisotropic Dry Etching
Reactor: 15" diameter parallel plate
Gas Mixture: 70–90 vol. % perfluoroethane remainder trifluorochloromethane
Power: 300–800 watts
Pressure: 0.2–0.5 cu. cm/min.
Flow rate: 60–150 cu. cm/min.
Etch rate: 80–130 nanometers/min.
(5) Etching of Aluminum and Aluminum Alloys
WET:
The wet etchant is a mixture of 85 parts by volume phosphoric acid; 5 parts acetic acid; 5 parts nitric acid; and 5 parts water. The etch rate is approximately 1 micrometer/min.
DRY:
Reactor: 15" diameter parallel plate
Gas Mixture: 75–95 vol. % carbon tetrachloride, remainder helium.
Power: 1,000–2,000 watts
Pressure: 0.2–0.5 Torr
Flow rate: 900–1500 $cm^3$/min for $CCl_4$ with He flow rate is adjusted to result in the desired total pressure.

Etch rate: 800–1500 nanometers/min. Currently this is the most rigorous of all plasma etching conditions with the resist frequently being subjected to temperatures in excess of 250 degrees C.

(6) Etching of Silicon Dioxide (thermal & CVD)
WET:
The liquid etchant is a standard buffered aqueous solution containing 34.6 weight percent ammonium fluroide and 6.8 weight percent hydrofluoric acid. The etch rate of this mixture is 100 nanometers/minute.
DRY:
Dry etching is done using the same conditions as phosphorous doped glass resulting in an etch rate of 60–100 nanometers/min. Examples 7 through 10 relate to dry processing.

(7) Ten grams of the material perpared in Example 1 is dissolved in 100 ml of distilled chlorobenzene and filtered through a 0.2 micrometer filter. A silicon wafer with 0.5 micrometer of aluminum film is spin coated at 2,000 rpm with this resist solution. The resist-coated substrate is prebaked at 135 degrees C. for 60 minutes and exposed with a scanning electron beam to a dose of 5 microcoulombs/cm$^2$ at 20 kilovolts. Development of the exposed film is effected by spraying a solution of 5 parts nitropropane and 1.5 parts of isopropyl alcohol for 45 seconds; this is followed by a 30 second spray of 2-propanol. The substrate and patterned resist is baked at 170 degrees C. for two hours. The substrate and resist is subjected to an oxygen plasma with the following conditions: Pressure, 1 Torr; Gas, wet air; Power, 200 watts; Reactor, 12" diameter tube. The purpose of this step is to remove any film residue in the bared areas. The bared aluminum is etched in a plasma-assisted dry etching procedure as previously described under 5. Etching of Aluminum and Aluminum Alloys (DRY). This plasma-assisted etching results in some polymer flow and in removal of approximately 35 percent of the polymer film. The resulting resolution is 1 micrometer.

(8) The procedure of Example 7 is repeated with the exception that an oxidized silicon substrate with a thickness of 0.5 micrometers is used. Etching of the silicon dioxide is effected with a plasma assisted etching technique as described in (6) Etching of Silicon Dioxide, (DRY).

(9) The procedure of Example 8 is repeated with the exception that use is made of a liquid etching technique described in (6) Etching of Silicon Dioxide (WET).

(10) The procedure of Example 7 is repeated with the exception that a 1.0 micrometer polysilicon film is deposited on the silicon wafer prior to resist application. Etching of the polysilicon film is effected with a plasma assisted etching technique as described in (4) Etching of Polysilicon (DRY).

F. Other Considerations

Appended claims recite or imply a number of considerations well known to those conversant with the concerned art. For example, it is recognized that electron beam resists are economically justifiable primarily where desired resolution is finer than that readily obtainable by photolithographic techniques. Accordingly, it is common practice to utilize focused electron beams capable of resolving desired detail. In present terms, this implies resolution limits of the order of a small number of micrometers or less and suggests the use of focused beams of the order of 1 micrometer or less. It is common practice to define the diameter of a beam of radiant energy in terms of the cross-sectional dimension through which the energy drop-off attains a minimum level of 1/e th of the center energy.

While fine resolution is the usual justification for e-beam lithography, apparatus is sometimes utilized in other modes. For example, available aparatus may provide for larger focused beam cross-sections or even defocused beams. A recently developed procedure utilizes a cathode shaped to emit a desired pattern. Such a cathode, which may emit electrons upon irradiation with X-ray or shorter wavelength wave energy, is capable of high resolution pattern delineation when closely spaced from the resist layer. To this end, spacings may be 25 micrometers or less.

I claim:

1. Process for fabrication of an article comprising an operation during which the article undergoing fabrication comprises an article surface and an overlying actinic processing layer, said processing layer consisting essentially of polymeric material including the steps of:
   (1) selectively exposing portions of the said processing layer to actinic radiation to define a pattern whereby ease of removal of the said portions of the processing layer by a developing agent is changed;
   (2) treating the said processing layer with said developing agent to selectively remove material to produce a patterned processing layer;
   (3) treating the article undergoing fabrication with an altering agent which preferentially alters regions of the said article surface corresponding with removed portions of the patterened processing layer, CHARACTERIZED IN THAT the said polymeric material is produced by treatment of a precursor polymeric material having a molecular weight distribution $M_w/M_n$ (said weight average molecular weight/number average molecular weight) of a maximum numerical value of 1.8, said precursor polymeric material having been produced by an anionic "living" polymerization, said treatment being the addition of functional groups to the said precursor polymeric material which imparts actinic properties which results in the said polymeric material, wherein the said polymeric material also has a molecular weight distribution $M_w/M_n$ of a maximum numerical value of 1.8.

2. The process of claim 1 in which ease of removal of the added processing layer is decreased, said ease of removal being dependent upon effective crosslinking of the said polymeric material resulting from exposure by the said actinic radiation.

3. Process of claim 2 in which said precursor polymeric material is polystyrene.

4. Process of claim 3 in which said treatment comprises halogenation.

5. Process of claim 4 in which said halogenation consists essentially of chlorination.

6. Process of claim 5 in which said chlorination is at a level of at least one chlorine atom per styrene moiety.

7. The process of claim 6 in which the molecular weight distribution $M_w/M_n$ of the said precursor polymeric material has a maximum numerical value of 1.5.

8. The process of claim 7 in which the molecular weight distribution $M_w/M_n$ of the said precursor polymeric material has a maximum numerical value of 1.1.

9. Process of claims 1, 2, 3, 4, 5, 6, 7 or 8 in which the said overlying actinic processing layer is in direct contact with the said article surface.

10. Process of claim 1 in which the said actinic radiation consists essentially of a focused electron beam.

11. Process of claim 1 in which the said actinic radiation consists essentially of electromagnetic radiation in the X-ray spectrum.

* * * * *